United States Patent
Partlo et al.

(10) Patent No.: US 7,180,083 B2
(45) Date of Patent: Feb. 20, 2007

(54) EUV LIGHT SOURCE COLLECTOR EROSION MITIGATION

(75) Inventors: William N. Partlo, Poway, CA (US); Alexander I. Ershov, San Diego, CA (US); Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 11/238,828

(22) Filed: Sep. 28, 2005

(65) Prior Publication Data

US 2006/0289808 A1   Dec. 28, 2006

Related U.S. Application Data

(63) Continuation-in-part of application No. 11/174,442, filed on Jun. 29, 2005, and a continuation-in-part of application No. 11/168,190, filed on Jun. 27, 2005.

(51) Int. Cl.
*A61N 5/06* (2006.01)
*G01J 3/10* (2006.01)
*H05G 2/00* (2006.01)

(52) U.S. Cl. .................................. 250/504 R
(58) Field of Classification Search ............. 250/504 R
See application file for complete search history.

(56) References Cited

U.S. PATENT DOCUMENTS

| | | | |
|---|---|---|---|
| 2,740,963 A | 4/1956 | Donovan | 342/34 |
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |

(Continued)

FOREIGN PATENT DOCUMENTS

JP    02-105478    4/1990

(Continued)

OTHER PUBLICATIONS

Andreev et al., Enhancement of Laser/EUV Conversion by Shaped Laser Pulse Interacting with Li-Contained Targets for EUV Litography, Proc. of SPIE 5196:128-136, (2004).

(Continued)

*Primary Examiner*—Jack Berman
*Assistant Examiner*—Jennifer Yantorno
(74) *Attorney, Agent, or Firm*—William Cray

(57) ABSTRACT

An EUV light source collector erosion mitigation system and method is disclosed which may comprise a collector comprising a multilayered mirror collector comprising a collector outer surface composed of a capping material subject to removal due to a removing interaction with materials created in an EUV light-creating plasma; a replacement material generator positioned to deliver replacement material comprising the capping material to the collector outer surface at a rate sufficient to replace the capping material removed due to the removing interaction. The replacement material generator may comprise a plurality of replacement material generators positioned to respectively deliver replacement material to a selected portion of the collector outer surface, which may comprise a sputtering mechanism sputtering replacement capping material onto the collector outer surface.

13 Claims, 1 Drawing Sheet

U.S. PATENT DOCUMENTS

| | | | |
|---|---|---|---|
| 3,961,197 A | 6/1976 | Dawson | 250/493 |
| 3,969,628 A | 7/1976 | Roberts et al. | 250/402 |
| 4,009,391 A | 2/1977 | Janes et al. | 250/281 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,223,279 A | 9/1980 | Bradford, Jr. et al. | 313/94.5 |
| 4,329,664 A | 5/1982 | Javan | 359/276 |
| 4,364,342 A | 12/1982 | Asik | 123/143 |
| 4,369,758 A | 1/1983 | Endo | 123/620 |
| 4,455,658 A | 6/1984 | Sutte, Jr. | 372/38 |
| 4,504,964 A | 3/1985 | Cartz et al. | 378/119 |
| 4,507,588 A | 3/1985 | Asmussen et al. | 315/39 |
| 4,534,035 A | 8/1985 | Long | 372/85 |
| 4,536,884 A | 8/1985 | Weiss et al. | 378/119 |
| 4,538,291 A | 8/1985 | Iwamatsu | 378/119 |
| 4,550,408 A | 10/1985 | Karning et al. | 372/58 |
| 4,561,406 A | 12/1985 | Ward | 123/536 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,774,914 A | 10/1988 | Ward | 123/162 |
| 4,837,794 A | 6/1989 | Riordan et al. | 378/119 |
| 4,891,820 A | 1/1990 | Rando et al. | 372/93 |
| 4,928,020 A | 5/1990 | Birx et al. | 307/106 |
| 4,959,840 A | 9/1990 | Akins et al. | 372/57 |
| 5,005,180 A | 4/1991 | Edelman et al. | 372/57 |
| 5,022,033 A | 6/1991 | Hackell | 372/25 |
| 5,023,884 A | 6/1991 | Akins et al. | 372/57 |
| 5,023,897 A | 6/1991 | Neff et al. | 378/122 |
| 5,025,445 A | 6/1991 | Anderson et al. | 372/20 |
| 5,025,446 A | 6/1991 | Kuizenga | 372/21 |
| 5,027,076 A | 6/1991 | Horsley et al. | 325/674 |
| 5,070,513 A | 12/1991 | Letardi | 372/83 |
| 5,091,778 A | 2/1992 | Keeler | 348/31 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,142,543 A | 8/1992 | Wakabayashi et al. | 372/32 |
| 5,157,684 A | 10/1992 | Benda et al. | 372/95 |
| 5,175,755 A | 12/1992 | Kumakhov | 378/34 |
| 5,181,135 A | 1/1993 | Keeler | 398/119 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,319,695 A | 6/1994 | Itoh et al. | 378/84 |
| 5,359,620 A | 10/1994 | Akins | 372/58 |
| RE34,806 E | 12/1994 | Cann | 427/446 |
| 5,411,224 A | 5/1995 | Dearman et al. | 244/53 |
| 5,425,922 A | 6/1995 | Kawaguchi | 422/186 |
| 5,448,580 A | 9/1995 | Birx et al. | 372/38 |
| 5,450,436 A | 9/1995 | Mizoguchi et al. | 372/59 |
| 5,463,650 A | 10/1995 | Ito et al. | 372/57 |
| 5,471,965 A | 12/1995 | Kapich | 123/565 |
| 5,504,795 A | 4/1996 | McGeoch | 378/119 |
| 5,563,555 A | 10/1996 | Nalos et al. | 331/81 |
| 5,729,562 A | 3/1998 | Birx et al. | 372/38 |
| 5,763,930 A | 6/1998 | Partlo | 250/504 |
| 5,852,621 A | 12/1998 | Sandstrom | 372/25 |
| 5,856,991 A | 1/1999 | Ershov | 372/57 |
| 5,863,017 A | 1/1999 | Larson et al. | 248/176.1 |
| 5,866,871 A | 2/1999 | Birx | 219/121 |
| 5,933,271 A | 8/1999 | Waarts et al. | 359/341.31 |
| 5,936,988 A | 8/1999 | Partlo et al. | 372/38 |
| 5,953,360 A | 9/1999 | Vitruk et al. | 372/87 |
| 5,963,616 A | 10/1999 | Silfvast et al. | 378/122 |
| 5,978,394 A | 11/1999 | Newman et al. | 372/32 |
| 5,991,324 A | 11/1999 | Knowles et al. | 372/57 |
| 6,005,879 A | 12/1999 | Sandstrom et al. | 372/25 |
| 6,016,323 A | 1/2000 | Kafka et al. | 372/38 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,031,241 A | 2/2000 | Silfvast et al. | 250/504 |
| 6,031,598 A | 2/2000 | Tichenor et al. | 355/67 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,067,306 A | 5/2000 | Sandstrom et al. | 372/38.01 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38.1 |
| 6,151,346 A | 11/2000 | Partlo et al. | 372/38 |
| 6,151,349 A | 11/2000 | Gong et al. | 372/58 |
| 6,164,116 A | 12/2000 | Rice et al. | 73/1.72 |
| 6,172,324 B1 | 1/2001 | Birx | 219/121.57 |
| 6,181,719 B1 | 1/2001 | Sukhman et al. | 372/38.1 |
| 6,192,064 B1 | 2/2001 | Algots et al. | 372/99 |
| 6,195,272 B1 | 2/2001 | Pascente | 363/21 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,281,471 B1 | 8/2001 | Smart | 219/121.62 |
| 6,285,743 B1 | 9/2001 | Kondo et al. | 378/119 |
| 6,304,630 B1 | 10/2001 | Bisschops et al. | 378/119 |
| 6,307,913 B1 | 10/2001 | Foster et al. | 378/34 |
| 6,359,922 B1 | 3/2002 | Partlo et al. | 372/58 |
| 6,370,174 B1 | 4/2002 | Onkels et al. | 372/38.04 |
| 6,377,651 B1 | 4/2002 | Richardson et al. | 378/34 |
| 6,381,257 B1 | 4/2002 | Ershov et al. | 372/57 |
| 6,392,743 B1 | 5/2002 | Zambon et al. | 355/69 |
| 6,396,900 B1 | 5/2002 | Barbee, Jr. et al. | 378/84 |
| 6,404,784 B2 | 6/2002 | Komine | 372/9 |
| 6,414,979 B2 | 7/2002 | Ujazdowski et al. | 372/87 |
| 6,442,181 B1 | 8/2002 | Oliver et al. | 372/25 |
| 6,452,194 B2 | 9/2002 | Bijkerk et al. | 250/492.2 |
| 6,452,199 B1 | 9/2002 | Partlo et al. | 250/504 |
| 6,466,602 B1 | 10/2002 | Fleurov et al. | 372/87 |
| 6,477,193 B2 | 11/2002 | Oliver et al. | 372/58 |
| 6,493,374 B1 | 12/2002 | Fomenkov et al. | 372/102 |
| 6,493,423 B1 | 12/2002 | Bisschops | 378/119 |
| 6,529,531 B1 | 3/2003 | Everage et al. | 372/20 |
| 6,532,247 B2 | 3/2003 | Spangler et al. | 372/61 |
| 6,535,531 B1 | 3/2003 | Smith et al. | 372/25 |
| 6,538,737 B2 | 3/2003 | Sandstrom et al. | 356/334 |
| RE38,054 E | 4/2003 | Hofmann et al. | 372/25 |
| 6,541,786 B1 | 4/2003 | Partlo et al. | 250/504 |
| 6,549,551 B2 | 4/2003 | Ness et al. | 372/38.07 |
| 6,553,049 B1 | 4/2003 | Besaucele et al. | 372/57 |
| 6,566,667 B1 | 5/2003 | Partlo et al. | 250/504 |
| 6,566,668 B2 | 5/2003 | Rauch et al. | 250/504 |
| 6,567,450 B2 | 5/2003 | Myers et al. | 372/55 |
| 6,567,499 B2 | 5/2003 | McGeoch | 378/119 |
| 6,576,912 B2 | 6/2003 | Visser et al. | 250/492.2 |
| 6,584,132 B2 | 6/2003 | Morton | 372/57 |
| 6,586,757 B2 | 7/2003 | Melnychuk et al. | 250/504 |
| 6,590,959 B2 | 7/2003 | Kandaka et al. | 378/119 |
| 6,621,846 B1 | 9/2003 | Sandstrom et al. | 372/57 |
| 6,625,191 B2 | 9/2003 | Knowles et al. | 372/55 |
| 6,635,844 B2 | 10/2003 | Yu | 219/121.68 |
| 6,647,086 B2 | 11/2003 | Amemiya et al. | 378/34 |
| 6,671,294 B2 | 12/2003 | Kroyan et al. | 372/20 |
| 6,714,624 B2 | 3/2004 | Fornaciari et al. | 378/119 |
| 6,721,340 B1 | 4/2004 | Fomenkov et al. | 372/25 |
| 6,744,060 B2 | 6/2004 | Ness et al. | 315/111.01 |
| 6,757,316 B2 | 6/2004 | Newman et al. | 372/57 |

| | | | | |
|---|---|---|---|---|
| 6,765,945 | B2 | 7/2004 | Sandstrom et al. | 372/57 |
| 6,782,031 | B1 | 8/2004 | Hofmann et al. | 372/90 |
| 6,795,474 | B2 | 9/2004 | Partlo et al. | 372/57 |
| 6,804,327 | B2 | 10/2004 | Schriever et al. | 378/119 |
| 6,815,700 | B2 | 11/2004 | Melnychuk et al. | 250/504 R |
| 6,822,251 | B1 | 11/2004 | Arenberg et al. | 250/504 |
| 6,841,322 | B1* | 1/2005 | Lee | 430/30 |
| 6,865,255 | B2 | 3/2005 | Richardson | 378/119 |
| 7,081,992 | B2* | 7/2006 | Tichenor et al. | 359/359 |
| 2001/0006217 | A1 | 7/2001 | Bisschops | 250/493.1 |
| 2001/0055364 | A1 | 12/2001 | Kandaka et al. | 378/119 |
| 2002/0006149 | A1 | 1/2002 | Spangler et al. | 372/61 |
| 2002/0009176 | A1 | 1/2002 | Ameniya et al. | 378/34 |
| 2002/0012376 | A1 | 1/2002 | Das et al. | 372/58 |
| 2002/0014598 | A1 | 2/2002 | Melnychuk et al. | 250/504 R |
| 2002/0014599 | A1 | 2/2002 | Rauch et al. | 250/504 R |
| 2002/0021728 | A1 | 2/2002 | Newman et al. | 375/55 |
| 2002/0048288 | A1 | 4/2002 | Kroyan et al. | 372/20 |
| 2002/0100882 | A1 | 8/2002 | Partlo et al. | 250/504 |
| 2002/0101589 | A1 | 8/2002 | Sandstrom et al. | 356/334 |
| 2002/0105994 | A1 | 8/2002 | Partlo et al. | 372/57 |
| 2002/0114370 | A1 | 8/2002 | Onkels et al. | 372/55 |
| 2002/0141536 | A1 | 10/2002 | Richardson | 378/119 |
| 2002/0154668 | A1 | 10/2002 | Knowles et al. | 372/55 |
| 2002/0162973 | A1 | 11/2002 | Cordingley et al. | 250/492.2 |
| 2002/0163313 | A1 | 11/2002 | Ness et al. | 315/111.01 |
| 2002/0168049 | A1 | 11/2002 | Schriever et al. | 378/119 |
| 2003/0006383 | A1 | 1/2003 | Melynchuk et al. | 250/504 |
| 2003/0068012 | A1 | 4/2003 | Ahmad et al. | 378/119 |
| 2003/0219056 | A1 | 11/2003 | Yager et al. | 372/57 |
| 2004/0047385 | A1 | 3/2004 | Knowles et al. | 372/55 |
| 2005/0155624 | A1* | 7/2005 | Lee et al. | 134/1.1 |
| 2005/0174576 | A1 | 8/2005 | Rao et al. | 356/454 |
| 2006/0131515 | A1* | 6/2006 | Partlo et al. | 250/504 R |

FOREIGN PATENT DOCUMENTS

| | | |
|---|---|---|
| JP | 03-173189 | 7/1991 |
| JP | 06-053594 | 2/1994 |
| JP | 09-219555 | 8/1997 |
| JP | 2000-058944 | 2/2000 |
| JP | 200091096 | 3/2000 |
| WO | WO2004/104707 | 12/2004 |

OTHER PUBLICATIONS

Apruzese, "X-Ray Laser Research Using Z Pinches," Am. Inst. Of Phys. 399-403, (1994).

Bollanti et al., "Compact Three Electrodes Excimer Laser IANUS for a POPA Optical System," SPIE Proc. (2206) 144-153, (1994).

Bollanti et al., "Ianus, the Three-Electrode Excimer Laser," App. Phys. B (Lasers & Optics) 66(4):401-406, (1998).

Braun et al., "Multi-Component EUV Multilayer Mirrors," Proc. SPIE, 5037:2-13 (2003).

Choi et al., "A $10^{13}$ A/s High Energy Density Micro Discharge Radiation Source," B. Radiation Characteristics, p. 287-290.

Choi et al., "Fast Pulsed Hollow Cathode Capillary Discharge Device," Rev. of Sci. Instrum. 69(9):3118-3122 (1998).

Choi et al., "Temporal Development of Hard and Soft X-Ray Emission from a Gas-Puff Z Pinch," Rev. Sci. Instrum. 57(8), pp. 2162-2164 (Aug. 1986).

Coutts et al., High Average Power Blue Generation from a Copper Vapour Laser Pumped Titanium Sapphire Laser, Journal of Modern Optics, vol. 45, No. 6, p. 1185-1197 (1998).

Feigl et al., "Heat Resistance of EUV Multilayer Mirrors for Long-Time Applications," Microelectric Engineering, 57-58:3-8, (2001).

Fomenkov et al., "Characterization of a 13.5nm Source for EUV Lithography based on a Dense Plasma Focus and Lithium Emission," Sematech Intl. Workshop on EUV Lithography (Oct. 1999).

Giordano et al., "Magnetic Pulse Compressor for Prepulse Discharge in Spiker-Sustainer Excitati Technique for XeCl Lasers," Rev. Sci. Instrum 65(8), pp. 2475-2481 (Aug. 1994).

Hansson et al., "Xenon Liquid Jet Laser-Plasma Source for EUV Lithography," Emerging Lithographic Technologies IV, Proc. of SPIE, vol. 3997:729-732 (2000).

Hercher, "Tunable single mode operation of gas lasers using intracavity tilted etalons," Applied Optics, vol. 8, No. 6, Jun. 1969, pp. 1103-1106.

Jahn, Physics of Electric Propulsion, McGraw-Hill Book Company, (Series in Missile and Space U.S.A.), Chap. 9, "Unsteady Electromagnetic Acceleration," p. 257 (1968).

Kato, "Electrode Lifetimes in a Plasma Focus Soft X-Ray Source," J. Appl. Phys. (33) Pt. 1 No. 8:4742-4744 (1991).

Kato et al., "Plasma Focus X-Ray Source for Lithography," Am. Vac. Sci. Tech. B, 6(1): 195-198 (1988).

Lebert et al., "Soft X-Ray Emission of Laser-Produced Plasmas Using a Low-Debris Cryogenic Nitrogen Target," J. App. Phys., 84(6):3419-3421 (1998).

Lebert et al., "A Gas Discharge Based Radiation Source for EUV-Lithography," Intl. Conf. Micro and Nano-Engineering 98 (Sep. 22-24,, 1998) Leuven, Belgium.

Lebert et al., "Investigation of Pinch Plasmas with Plasma Parameters Promising ASE," Inst. Phys. Conf. Ser. No. 125: Section 9, pp. 411-415 (1992) Schiersee, Germany.

Lebert et al., "Comparison of Laser Produced and Gas Discharge Based EUV Sources for Different Applications," Intl. Conf. Micro- and Nano-Engineering 98 (Sep. 22-24, 1998) Leuven Belgium.

Lee, "Production of Dense Plasmas in Hypocyloidal Pinch apparatus," The Phys. of Fluids, 20 (2):313-321 (1977).

Lewis, "Status of Collision-Pumped X-Ray Lasers," Am. Inst. Phys. pp. 9-16 (1994).

Lowe, "Gas Plasmas Yield X-Rays for Lithography," Electronics, pp. 40-41 (Jan. 27, 1982).

Malmqvist et al., "Liquid-Jet Target for Laser-Plasma Soft X-Ray Generation," Am. Inst. Phys. 67(12):4150-4153 (1996).

Maruyama et al., "Characteristics of High-Power Excimer Laser Master Oscillator Power amplifier System for Dye Laser Pumping", Optics Communications, vol. 87, No. 3, pp. 105-108 (1992).

Mather, "Formation of a High-Density Deuterium Plasma Focus," The Physics of Fluids, 8(2), 366-377 (Feb. 1965).

Mather et al., "Stability of the Dense Plasma Focus," Phys. of Fluids, 12(11):2343-2347 (1969).

Matthews et al., "Plasma Sources for X-Ray Lithography," SPIE, 333, Submicron Lithography, pp. 136-139 (1982).

Mayo et al., "A Magnetized Coaxial Source Facility for the Generation of Energetic Plasma Flows," Sci. Technol. vol. 4:pp. 47-55 (1994).

Mayo et al., "Initial Results on High Enthalphy Plasma Generation in a Magnetized Coaxial Source," Fusion Tech. vol. 26:1221-1225 (1994).

Nilsen et al., "Analysis of Resonantly Photopumped Na-Ne X-Ray-Laser Scheme," Am. Phys. Soc. 44(7):4591-4597 (1991).

Orme et al., "Electrostatic Charging and Deflection of Nonconventional Droplet Streams Formed from Capillary Stream Breakup," Physics of Fluids, 12(9):2224-2235, (Sep. 2000).

Orme et al., "Charged Molten Metal Droplet Deposition as a Direct Write Technology", MRS 2000 Spring Meeting, San Francisco (Apr. 2000).

Pant et al., "Behavior of Expanding Laser Produced Plasma in a Magnetic Field," Physica Sripta, T75:104-111, (1998).

Partlo et al., "EUV (13.5 nm) Light Generation Using a Dense Plasma Focus Device," SPIE Proc. on Emerging Lithographic Technologies III, vol. 3676, 846-858 (Mar. 1999).

Pearlman et al., "X-Ray Lithography Using a Pulsed Plasma Source," J. Vac. Sci. Technol., pp. 1190-1193 (Nov./Dec. 1981).

Porter et al., "Demonstration of Population Inversion by Resonant Photopumping in a Neon Gas Cell Irradiated by a Sodium Z Pinch," Phys. Rev. Let., 68(6);796-799, (Feb. 1992).

Price, "X-Ray Microscopy Using Grazing Incidence Reflection Optics," Am. Inst. Phys., pp. 189-199, (1981).

Qi et al., "Fluorescence in Mg IX Emission at 48.340 Å from Mg Pinch Plasmas Photopumped by Al XI Line Radiation at 48.338 Å," Them Am. Phys. Soc., 47(3):2253-2263 (Mar. 1993).

Scheuer et al., "A Magnetically-Nozzled, Quasi-Steady, Multimegawatt, Coaxial Plasma Thruster," IEEE: Transactions on Plasma Science, 22(6) (Dec. 1994).

Schriever et al., "Laser-Produced Lithium Plasma as a Narrow-Band Extended Ultraviolet Radiation Source for Photoelectron Spectroscopy," App. Optics, 37(7):1243-1248, (Mar. 1998).

Schriever et al., "Narrowband Laser Produced Extreme Ultraviolet Sources Adapted to Silicon/Molybdenum Multilayer Optics," J. of App. Phys., 83(9):4566-4571, (May 1998).

Shiloh et al., "Z Pinch of a Gas Jet," Physical Review Lett., 40(8), pp. 515-518 (Feb. 20, 1978).

Silfvast et al., "High-Power Plasma Discharge Source at 13.5 nm and 11.4 nm for EUV Lithography," SPIE, vol. 3676:272-275, (Mar. 1999).

Silfvast et al., Lithium Hydride Capillary Discharge Creates X-Ray Plasma at 13.5 Nanometers, Laser Focus World p. 12 (Mar. 1997).

Stallings et al., "Imploding Argon Plasma Experiments," Appl., Phys. Lett. 35(7), pp. 524-536 (Oct. 1, 1979).

Tada et al., "1-pm Spectrally Narrowed Compact ArF Excimer Laser for Microlithography", Laser and Electro-Optics, CLEO '96, CThG4, p. 374 (1996).

Tillack et al., "Magnetic Confinement of an Expanding Laser-Produced Plasma," UC San Diego, Center for Energy Research, UCSD Report & Abramoya—Tornado Trap.

Wilhein et al., "A Slit Grating Spectrograph for Quantitative Soft X-Ray Spectroscopy," Am. Inst. Of Phys. Rev. of Sci. Instrum., 70(3):1694-1699, (Mar. 1999).

Wu et al., "The Vacuum Spark and Spherical Pinch X-Ray/EUV Point Sources," SPIE, Conf. On Emerging Tech. III, Santa Clara, CA, vol. 3676:410-420, (Mar. 1999).

Yusheng et al., "Recent Progress of "Heaven-One" High Power KrF Excimer Laser Syste", Laser and Electo-Optics, CLEO/Pacific Rim '99, vol. 2, p. 302-303 (1999).

Zombeck, "Astrophysical Observations with High Resolution X-Ray Telescope," Am. Inst. Of Phys. pp. 200-209, (1981).

* cited by examiner

EUV LIGHT SOURCE COLLECTOR EROSION MITIGATION

CROSS-REFERENCE TO RELATED APPLICATIONS

The present application is a continuation-in-part of U.S. patent application Ser. No. 11/174,442, entitled SYSTEMS AND METHODS FOR REDUCING THE INFLUENCE OF PLASMA-GENERATED DEBRIS ON THE INTERNAL COMPONENTS OF AN EUV LIGHT SOURCE, filed on Jun. 29, 2005, and Ser. No. 11/168,190, entitled filed on Jun. 27, 2005, the disclosures of which are hereby incorporated by reference.

FIELD OF THE INVENTION

The present invention related to LPP EUV light source collector erosion mitigation.

BACKGROUND OF THE INVENTION

Experiments have shown that extreme ultraviolet ("EUV") light sources, e.g., produced by a laser produced plasma ("LPP"), using a metal such as tin for a plasma source material suffers from erosion of the primary collector mirror. This erosion is due to, e.g., sputtering by energetic source material ions, e.g., tin ions and neutrals created by the LPP. Applicants propose apparatus and methods for addressing this issue.

SUMMARY OF THE INVENTION

An EUV light source collector erosion mitigation system and method is disclosed which may comprise a collector comprising a multilayered mirror collector comprising a collector outer surface composed of a capping material subject to removal due to a removing interaction with materials created in an EUV light-creating plasma; a replacement material generator positioned to deliver replacement material comprising the capping material to the collector outer surface at a rate sufficient to replace the capping material removed due to the removing interaction. The replacement material generator may comprise a plurality of replacement material generators positioned to respectively deliver replacement material to a selected portion of the collector outer surface, which may comprise a sputtering mechanism sputtering replacement capping material onto the collector outer surface. The system and method may further comprise an EUV light detector providing an indication of the EUV reflectivity of the collector; and a replacement material generator control mechanism controlling the delivery of replacement material to the collector outer surface, which may comprise controlling the rate of delivery of the replacement material.

DETAILED DESCRIPTION OF PREFERRED EMBODIMENTS

Figure 1:
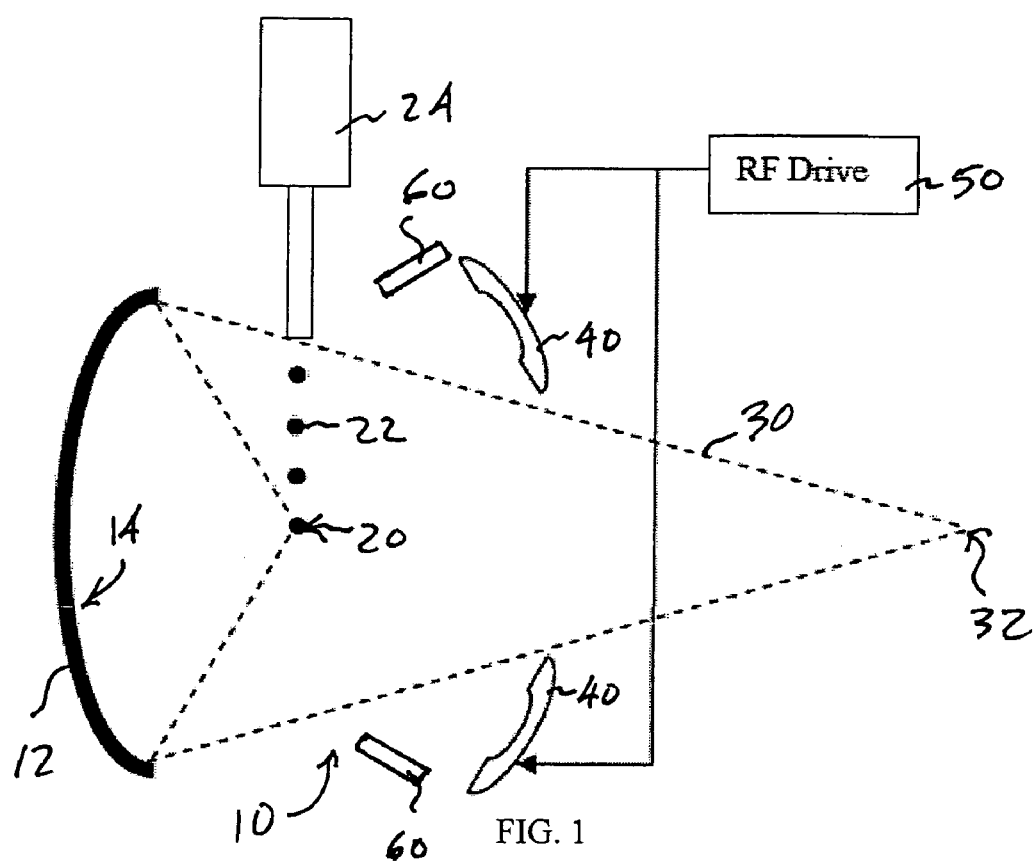
FIG. 1 shows schematically an example of an EUV light source plasma initiation site and associated EUV light collector according to aspects of an embodiment of the present invention.

In order to achieve a commercially viable collector lifetime applicants propose apparatus and methods for addressing the erosion by, according to aspects of embodiments of the present invention, e.g., replacing the material in-situ within the plasma production chamber during operation of the LPP EUV light source.

According to aspects of an embodiment of the present invention and apparatus and method for replacing eroded mirror material can involve, e.g., the installation of sputter sources around the parameter of the collector assembly that, e.g., can continuously provide mirror coating material, e.g., at a rate equal to the removal rate due to sputtering from the plasma source material, e.g., tin sputtering or other sputtering. An exemplary configuration is shown schematically in FIG. 1.

Turning now to FIG. 1 there is shown that several sputter sources can be placed such that they, e.g., provide full coverage of the collector mirror and, e.g., produce a combined deposition rate profile across the mirror surface that is equal to the erosion rate profile across the mirror surface.

A proper deposition rate of the sputter sources separately and collectively must be carefully selected. According to aspects of an embodiment of the present invention one method for doing so could be to characterize the erosion profile of an unprotected mirror and, e.g., produce a static deposition profile to match, with the required control over the deposition profile being such that the net material removal rate approaches almost perfectly zero.

As an alternative, according to aspects of an embodiment of the present invention one might use an in-situ metrology to provide a feed-back control for the deposition rate. By way of an example of such a system, and assuming, e.g., that the deposited material is to be molybdenum, the EUV reflectivity of an EUV mirror will, e.g., start to decrease as the top layer thickness of molybdenum increases beyond a certain limit, e.g., due to the sputtering from the controlled molybdenum sputtering sources. Since these EUV mirrors will have a large number of layers, there is little or no change in reflectivity with the loss of one or two mirror layers. One could, therefore, according to aspects of an embodiment of the present invention, monitor the EUV reflectivity in-situ and deposit molybdenum until the reflectivity drops by a selected amount, e.g., a few percent or perhaps even less, within some tolerances for the metrology to measure relatively accurately and also within some bounds of ability to sacrifice reflectivity and still maintain a desired energy output. According to aspects of an embodiment of the present invention the output EUV light energy if the entire system, e.g., as delivered to the intermediate focus as discussed below, may be used as such a measure of reflectivity or individual EUV detectors, as discussed below may be positioned to detect reflectivity changes of selected portions of the collector.

Then, as the EUV source is operated and plasma source material sputtering, e.g., tin sputtering begins removing molybdenum from the mirror surface the mirror reflectivity begins to increase back to its uncoated value. This increase, e.g., can be monitored and used as a feed-back for the sputter coating rate of molybdenum. The metrology may comprise a plurality of detectors sampling different portions of the collector surface and/or a plurality of witness plates positioned to simulate erosion at differing locations of the collector surface.

As shown schematically and by way of example in FIG. 1, an LPP EUV light source 10 may comprise an EUV light collector 12. Plasma source material, e.g., tin or lithium, may be delivered to a plasma initiation site 20 in the form of target droplets 22, delivered from a target droplet generator 24. The target droplets, in turn, may be irradiated, e.g., by a laser beam (not shown) to form a plasma which emits EUV light, e.g., at about 13.5 nm wavelength. The collector 12 may comprise an elliptically shaped multilayer mirror for reflecting EUV light with a focus of the ellipse forming the mirror shape at the plasma initiation site 20 and focus a cone of EUV light 30 to an intermediate focus 32 at the second focus of the ellipse, where, e.g., the EUV light may be delivered to a device utilizing the light, e.g., an integrated circuit manufacturing process photolithography apparatus (not shown).

A plurality of replacement material delivering devices 40, two of which are shown by way of illustration in FIG. 1, may be positioned outside of the cone 30 to deliver replacement material, e.g., molybdenum to the outer surface 14 of the multilayer mirror forming the collector 12. The replacement material delivery devices 40 may comprise an apparatus for sputtering the replacement material, e.g., molybdenum onto at least some portion of the collector 12 outer surface 14, such as a "Torus" Magnetron Sputterer Source, made by Kurt T. esker Company of Pittsburgh, Pa. The sputtering mechanism 40 may be provided with an RF source 50, which may be part of the sputtering mechanism 40 to drive the rate of sputtering by the sputtering mechanism 40 and thus the rate of delivery of the replacement material to the collector 12 outer surface 14.

EUV light intensity detectors 60, such as a model XUV100 made by International Radiation Detectors, Inc. of Torrance, Calif. may be positioned to detect changes in reflectivity from a selected portion of the collector 12 outer surface 14.

While the particular aspects of embodiment(s) of the EUV LIGHT SOURCE COLLECTOR EROSION MITIGATION described and illustrated in this patent application in the detail required to satisfy 35 U.S.C. § 112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present EUV LIGHT SOURCE COLLECTOR EROSION MITIGATION is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. § 112, sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. In additions to changes and modifications to the disclosed and claimed aspects of embodiments of the present invention(s) noted above others could be implemented.

We claim:

1. An EUV light source collector erosion mitigation system comprising:
   a collector comprising a multilayered mirror collector comprising a collector outer surface composed of a capping material subject to removal due to a removing interaction with materials created in an EUV light-creating plasma;
   a replacement material generator positioned to deliver replacement material comprising the capping material to the collector outer surface at a rate sufficient to replace the capping material removed due to the removing interaction.

2. The apparatus of claim 1 further comprising:
   the replacement material generator comprises a plurality of replacement material generators positioned to respectively deliver replacement material to a selected portion of the collector outer surface.

3. The apparatus of claim 1 further comprising:
   the replacement material generator comprises a sputtering mechanism sputtering replacement capping material onto the collector outer surface.

4. The apparatus of claim 2 further comprising:
   the replacement material generator comprises a sputtering mechanism sputtering replacement capping material onto the collector outer surface.

5. The apparatus of claim 1 further comprising:
   an EUV light detector providing an indication of the EUV reflectivity of the collector;
   a replacement material generator control mechanism controlling the delivery of replacement material to the collector outer surface.

6. The apparatus of claim 2 further comprising:
   an EUV light detector providing an indication of the EUV reflectivity of the collector;

a replacement material generator control mechanism controlling the delivery of replacement material to the collector outer surface.

7. The apparatus of claim 3 further comprising:

an EUV light detector providing an indication of the EUV reflectivity of the collector;

a replacement material generator control mechanism controlling the delivery of replacement material to the collector outer surface.

8. The apparatus of claim 4 further comprising:

an EUV light detector providing an indication of the EUV reflectivity of the collector;

a replacement material generator control mechanism controlling the delivery of replacement material to the collector outer surface.

9. The apparatus of claim 5 further comprising:

the replacement material generator controlling mechanism controls the rate of delivery of the replacement material.

10. The apparatus of claim 6 further comprising:

the replacement material generator controlling mechanism controls the rate of delivery of the replacement material.

11. The apparatus of claim 7 further comprising:

the replacement material generator controlling mechanism controls the rate of delivery of the replacement material.

12. The apparatus of claim 8 further comprising:

the replacement material generator controlling mechanism controls the rate of delivery of the replacement material.

13. An EUV light source collector erosion mitigation method for a collector comprising a multilayered mirror collector comprising a collector outer surface composed of a capping material subject to removal due to a removing interaction with materials created in an EUV light-creating plasma, the method comprising:

utilizing a replacement material generator to deliver replacement material comprising the capping material to the collector outer surface at a rate sufficient to replace the capping material removed due to the removing interaction.

* * * * *